(12) United States Patent
Wegleiter et al.

(10) Patent No.: US 6,531,405 B1
(45) Date of Patent: *Mar. 11, 2003

(54) PROCESS FOR PRODUCING A LIGHT-EMITTING AND/OR A LIGHT-RECEIVING SEMICONDUCTOR BODY

(75) Inventors: Walter Wegleiter, Nittendorf (DE); Ernst Nirschl, Wenzenbach (DE); Helmut Fischer, Lappersdorf (DE)

(73) Assignee: Siemens Aktiengesellschaft, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/250,877

(22) Filed: Feb. 16, 1999

Related U.S. Application Data

(63) Continuation of application No. PCT/DE97/01729, filed on Aug. 13, 1997.

(30) Foreign Application Priority Data

Aug. 13, 1996 (DE) .......................... 196 32 627

(51) Int. Cl.⁷ ............................................. H01L 21/302
(52) U.S. Cl. ...................... 438/745; 438/749; 438/752
(58) Field of Search .................. 257/96, 97, 103, 257/86; 438/46, 47, 45, 962, 478, 26, 745, 749, 752

(56) References Cited

U.S. PATENT DOCUMENTS

| 4,216,484 A | * | 8/1980 | Hasegawa et al. ............. 257/94 |
| 4,447,825 A | * | 5/1984 | Oana et al. .................. 257/743 |
| 4,575,577 A | * | 3/1986 | Fraas ........................ 438/74 |
| 4,582,952 A | | 4/1986 | McNeely et al. ............ 136/249 |
| 4,670,093 A | * | 6/1987 | Maerz et al. ................. 438/39 |
| 4,819,057 A | * | 4/1989 | Naito et al. .................... 257/79 |
| 4,937,836 A | * | 6/1990 | Yamamoto et al. ........... 372/48 |
| 5,429,954 A | | 7/1995 | Gerner ......................... 438/33 |
| 5,436,201 A | * | 7/1995 | Chi et al. .................... 438/750 |
| 5,689,123 A | * | 11/1997 | Major et al. ................. 257/190 |
| 5,731,209 A | * | 3/1998 | Yamada et al. ............. 436/106 |
| 5,751,014 A | * | 5/1998 | Nakatsu et al. ................ 257/25 |
| 5,869,849 A | * | 2/1999 | Jou et al. ...................... 257/96 |

FOREIGN PATENT DOCUMENTS

| DE | 4305296 A1 | 8/1994 |
| EP | 0198199 A2 | 10/1986 |
| EP | 0404565 A1 | 12/1990 |
| EP | 0584599 A1 | 3/1994 |

OTHER PUBLICATIONS

Semiconductor with Etched Semiconductor Pellet–Formed by Cutting Wafer Provided with pn–junctions and Etching to remove Damaged Part of Junction, Mitsubishi Electric Corp, 1979.*

"Chemical Cleaning of Gratings in Distributed Feedbach InP Lasers", D.T.C. Huo et al., 1046 Journal of the Electrochemical Society 137, Nov. 1990, No. 11, Manchester, pp. 3639–3642.

Japanese Patent Abstract No. 59–112666 (Oodonari), dated Jun. 29, 1984.

* cited by examiner

*Primary Examiner*—Benjamin L. Utech
*Assistant Examiner*—Duy-Vu Deo
(74) *Attorney, Agent, or Firm*—Laurence A. Greenberg; Werner H. Stemer; Ralph E. Locher

(57) ABSTRACT

A light-emitting and/or light-receiving semiconductor body is produced with one or more semiconductor layers composed of $GaAs_xP_{1-x}$, where $0 \leq x < 1$. At least a portion of the surface of the semiconductor layer is first treated with an etching solution $H_2SO_4:H_2O_2:H_2O$ in a first etching step and then with hydrofluoric acid in a second etching step. The etching results in a surface roughness on the treated portion of the surface of the semiconductor layer.

13 Claims, 3 Drawing Sheets

PROCESS FOR PRODUCING A LIGHT-EMITTING AND/OR A LIGHT-RECEIVING SEMICONDUCTOR BODY

CROSS-REFERENCE TO RELATED APPLICATION

This is a continuation of copending International Application PCT/DE97/01729, filed Aug. 13, 1997, which designated the United States.

BACKGROUND OF THE INVENTION

Field of the Invention

The present invention lies in the field of semiconductors. Specifically, the invention relates to a process for producing a light-emitting and/or light-receiving semiconductor body having at least one semiconductor layer composed of $GaAs_xP_{1-x}$, where $0 \leq x < 1$.

Light-emitting diodes with semiconductor bodies of that type are known in the art. For instance, European patent application EP 584 599, describes a light-emitting diode chip in which an n-conducting GaP epitaxial layer is applied to an n-conducting GaP substrate and a p-conducting GaP epitaxial layer is applied to the n-conducting GaP epitaxial layer. The underside of the GaP substrate is provided with a contact metalization layer made of an Au—Ge alloy and a contact metalization layer is applied to the top side of the p-conducting GaP epitaxial layer. The latter contact metalization layer is composed, proceeding from the p-conducting GaP epitaxial layer, for example, of an Au layer, an Au—Zn layer, a Ti—W—N layer, and an Au or Al layer.

Furthermore, light-emitting diodes are known in which a layer sequence made of GaAsP is applied to a GaP substrate by means of epitaxy. That layer sequence has, for example, proceeding from the GaP substrate, first of all a GaAsP transition layer with an increasing As content, an n-doped GaAsP layer (dopant: e.g. tellurium or sulfur) and a p-doped GaAsP layer (dopant: zinc). A contact metalization layer is applied to the p-doped GaAsP layer. The metalization layer comprises, for example, proceeding from the p-doped GaAsP layer, a gold-zinc layer, a TiWN layer and an aluminum layer. The underside of the GaP substrate is provided with a contact metalization layer comprising, for example, a gold-germanium layer applied to the GaP substrate.

Depending on the As content, a light-emitting diode which emits light from the yellow up to super red region can be produced using a semiconductor body described above. However, the disadvantage of these semiconductor bodies is that only a fraction of the light generated in the semiconductor body is coupled out from the semiconductor body.

U.S. Pat. No. 4,582,952 describes a solar cell which, proceeding from a transparent GaP substrate, is constructed from a first p-doped GaAsP layer having a gradated As content, a second p-doped GaAsP layer, an n-doped GaAsP layer and a GaP covering layer. The GaP substrate and the GaP covering layer are each provided with a plurality of metal contacts.

The efficiency of a light-emitting diode or of a photodiode or solar cell is determined to an appreciable extent by the losses occurring when the radiation exits from or enters into the semiconductor body. A primary cause of these losses is the considerable difference between the refractive indices of the semiconductor material and the adjoining medium (for example air or plastic encapsulation). The large difference has the effect that a very small critical angle of total reflection for the passage of radiation through the surface of the semiconductor body exists. The proportion of radiation which exits directly from the semiconductor body, however, is only that proportion which is incident on the interface at a smaller angle with respect to the normal to the surface than the critical angle. The remaining proportion of the radiation is reflected back into the semiconductor body.

SUMMARY OF THE INVENTION

It is accordingly an object of the invention to provide a process for producing a light-emitting and/or receiving semiconductor body having at least one semiconductor layer made of $GaAs_xP_{1-x}$, where $0 \leq x < 1$, which overcomes the above-mentioned disadvantages of the heretofore-known devices and methods of this general type and which exhibits improved output coupling and/or input coupling of light as compared with the prior art.

With the foregoing and other objects in view there is provided, in accordance with the invention, a process for producing a light-emitting and/or light-receiving semiconductor body with at least one semiconductor layer composed of $GaAs_xP_{1-x}$, where $0 \leq x < 1$. The method comprises:

treating at least a part of a surface of the semiconductor layer in a first etching step with an etching solution having the composition $H_2SO_4:H_2O_2:H_2O$ and in a second etching step with hydrofluoric acid, for producing a roughness on the surface of the semiconductor layer.

In accordance with an added feature of the invention, the roughness resulting from the two etching steps is a multiplicity of mutually adjacent sawteeth formed in the surface of the semiconductor layer.

In other words, at least a portion of the surface of the semiconductor layer is treated with an etching solution ($H_2SO_4:H_2O_2:H_2O$) and then with dilute hydrofluoric acid. This results in a roughness on the treated part of the surface of the semiconductor layer.

The advantageous effect achieved by the roughness of the surface is that, in comparison with a planar surface, a larger proportion of the radiation generated in the semiconductor body impinges on the surface of the semiconductor layer at an angle which is smaller than the critical angle of total reflection.

A further advantage of the roughened semiconductor surface is that, in the embodiment in which the semiconductor body is surrounded directly by a plastic encapsulation, increased adhesive strength between the semiconductor body and the plastic encapsulation is obtained. This reduces the risk of detachment of the plastic encapsulation from the semiconductor body during operation and consequently accelerated aging of the semiconductor component.

In accordance with another feature of the invention, a GaP semiconductor substrate is provided and a layer sequence with at least one nitrogen-doped GaP epitaxial layer is applied on the substrate. Alternatively, a layer sequence is applied with at least one $GaAs_xP_{1-x}$ epitaxial layer, where $0 < x < 1$.

In accordance with an additional feature of the invention, the treating step comprises forming the roughness on an entire free surface of the semiconductor body. In a semiconductor body having an n-doped GaP substrate on which a layer sequence made of GaAsP is applied, the entire free surface of the semiconductor body is roughened. In this case, free surface is to be understood to mean that partial region of the surface which is not provided with a contact metalization layer.

In the case of light-emitting diodes having such a semiconductor body which is suitable for the generation of light, the GaP substrate is transmissive for the electromagnetic radiation generated in the GaAsP layer sequence, since the energy gap of GaAsP is smaller than that of GaP. Therefore, the radiation can advantageously be coupled out from the semiconductor body through the entire free surface thereof.

With the above and other objects in view there is also provided, in accordance with the invention, a process for simultaneously producing a plurality of light-emitting and/or light-receiving semiconductor bodies having at least one semiconductor layer composed of a semiconductor material selected from the group consisting of $GaAs_xP_{1-x}$, where $0 \leq x < 1$, and GaP:N, the method which comprises:

forming a layer sequence of $GaAs_xP_{1-x}$, where $0 \leq x < 1$, on a GaP substrate wafer;

applying a first contact metalization to an underside of the substrate wafer and applying at least one second contact metalization to a top side of the layer sequence;

treating a free surface of the layer sequence with an etching solution having the composition $H_2SO_4:H_2O_2:H_2O$ in a first etching step and with hydrofluoric acid in a second etching step, for producing a roughness in the free surface; and severing a semiconductor wafer comprising the substrate wafer, the layer sequence, the first contact metalization and the second contact metalization into individual semiconductor bodies.

In an alternative process of the invention, the following method steps are effected:

forming a layer sequence of $GaAs_xP_{1-x}$, where $0 \leq x < 1$, on a GaP substrate wafer;

applying a first contact metalization to an underside of the substrate wafer and applying a plurality of second contact metalizations to a top side of the layer sequence;

placing a semiconductor wafer comprising the substrate wafer, the layer sequence, the first contact metalization, and the second contact metalization on a carrier;

severing the semiconductor wafer into individual semiconductor bodies with free surfaces; and treating the free surfaces of the semiconductor bodies with an etching solution having the composition $H_2SO_4:H_2O_2:H_2O$ in a first etching step and with hydrofluoric acid in a second etching step, for producing a roughness in the free surfaces.

It is advantageous for a contact metalization layer applied to an underside of the GaP substrate to have a reflecting surface at the boundary with the semiconductor body. The consequence of this is that the radiation emitted by the GaAsP layer sequence in the direction of the contact metalization layer is largely reflected from the latter and can subsequently be coupled out through the free surface.

In accordance with a further feature of the invention, the first etching step in all of the above alternatives comprises selecting a ratio of 3:1:1 for the etching solution $H_2SO_4:H_2O_2:H_2O$, choosing a temperature of between 15 and 80° C. and an etching duration of between 30 seconds and 10 minutes. Among other advantages, these process parameters render a semiconductor body surface completely free of contamination and other residues.

In accordance with a concomitant feature of the invention, the second etching step comprises etching with 40–50% hydrofluoric acid, at a temperature of between 15 and 30° C. (preferably 25°), and for an etching duration of between 30 minutes and 120 minutes.

The resulting surface roughness attained with the two etching steps has the shape of sawteeth which are arranged next to one another and have a height of approximately 1 $\mu$m. In the case of light-emitting diodes, a light increase of approximately 40% can advantageously be obtained as a result of this.

As noted above, in another preferred development of the novel process, the semiconductor body has a GaP substrate on which there is applied a layer sequence made of nitrogen (N)-doped GaP (in short: GaP:N). In the case of such a semiconductor body which is also suitable for the generation of light the substrate is advantageously transmissive for the radiation generated in the GaP layer sequence, with the result that in this case, too, a substantial increase in the output coupling of light is obtained by virtue of the roughness of the semiconductor surface.

In a particularly advantageous process for simultaneously producing a plurality of semiconductor bodies of the type mentioned in the introduction, a layer sequence made of $GaAs_xP_{1-x}$, where $0 \leq x < 1$, or GaP:N is firstly applied to a substrate wafer made of GaP. Afterwards, a first contact metalization layer is applied to the underside of the substrate wafer and a plurality of second contact metalization layers are applied to the top side of the layer sequence. Subsequently, the free surface of the layer sequence is firstly treated with the etching solution having the composition $H_2SO_4:H_2O_2:H_2O$ in a first etching step and with hydrofluoric acid (HF) in a second etching step.

Finally, the semiconductor wafer, comprising substrate wafer, layer sequence, first and second contact metalization layers, is separated to form individual semiconductor bodies, for example light-emitting diode chips.

If provision is made for the side areas of the semiconductor bodies to be roughened as well, then after the application of the first and second contact metalization layers, the semiconductor wafer is applied for example to an adhesive film or another carrier and separated into individual light-emitting diode semiconductor bodies. The two above-mentioned etching steps are subsequently carried out before the separated semiconductor bodies are then lifted off from the carrier and processed further to form light-emitting diodes, for example.

Other features which are considered as characteristic for the invention are set forth in the appended claims.

Although the invention is illustrated and described herein as embodied in a process for producing a light-emitting and/or receiving semiconductor body, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
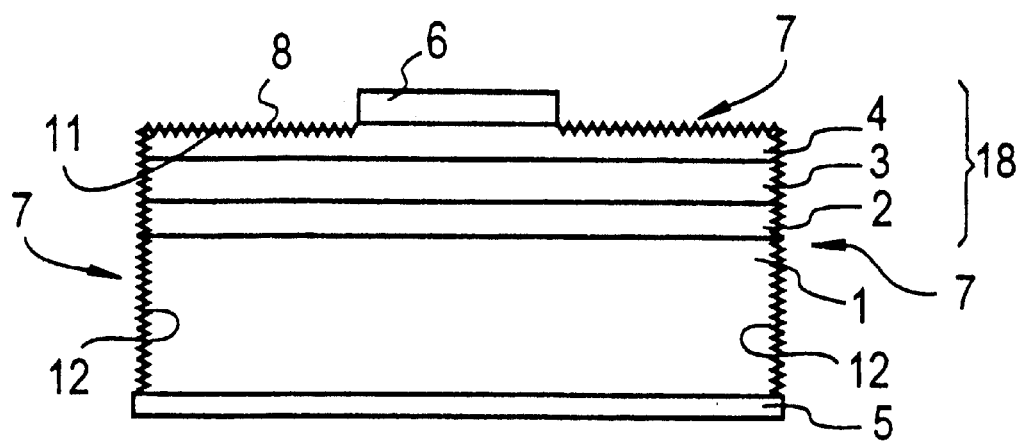
FIG. 1 is a diagrammatic side view of a semiconductor body produced in accordance with a first exemplary embodiment of the process according to the invention.

Referring now to the figures of the drawing in detail, in which identical parts are identified with the same reference symbols throughout, and first, particularly, to FIG. 1 thereof, there is seen a light-emitting semiconductor body, for example a light-emitting diode semiconductor body. A light-emitting layer sequence 18 is arranged on a GaP substrate 1. Applied on the GaP substrate 1 is, for example, a first $GaAs_xP_{1-x}$ epitaxial layer 2, where $0 \leq x < 1$, over which is arranged, in turn, a for example n-doped, second $GaAs_xP_{1-x}$ epitaxial layer 3, where $0 \leq x < 1$. Te or S may be used, for example, as the n-type dopant.

A p-doped, third $GaAs_xP_{1-x}$ epitaxial layer 4, where $0 \leq x < 1$, which is doped with Zn, for example, is applied on the second $GaAs_xP_{1-x}$ epitaxial layer 3. Proceeding from the GaP substrate 1, the first $GaAs_xP_{1-x}$ epitaxial layer 2 has an increasing As content, for example from x=0 up to x=As content of the second $GaAs_xP_{1-x}$ epitaxial layer 4.

The underside of the GaP substrate 1 is provided with a first contact metalization layer 5, which comprises a layer sequence Au—Ge alloy/Ag/Au, for example. A second contact metalization layer 6 is applied on the top side of the third $GaAs_xP_{1-x}$ epitaxial layer 4. The second contact metalization layer has, for example, an Au—Zn layer, applied directly to the third $GaAs_xP_{1-x}$ epitaxial layer 4, and an Au layer applied on the Au—Zn layer. However, any other material and layer combination that is known to those skilled in the art to be suitable can also be used for the contact metalization layers 5 and 6.

The entire free surface 7, that is to say that surface of the semiconductor body which is not covered by the first 5 and second 6 contact metalization layers, in this case this is part of the top side 11 and the side areas 12, is provided with a roughness 8. The latter has a structure of sawteeth (height approximately 1 µm, for example) arranged next to one another.

The process for producing the roughness 8 comprises a first and a second etching step, the free surface 7 of the semiconductor body being treated with an etching solution having the composition $H_2SO_4:H_2O_2:H_2O$ (3:1:1) in the first etching step and with hydrofluoric acid (40 to 50%) in the second etching step.

The first etching step is carried out at a temperature of between 15 and 80° C., in particular 25° C., and lasts for between 30 seconds and 10 minutes. The second etching step is carried out at a temperature of between 15 and 30° C. and lasts for between 30 minutes and 120 minutes.

Figure 2:
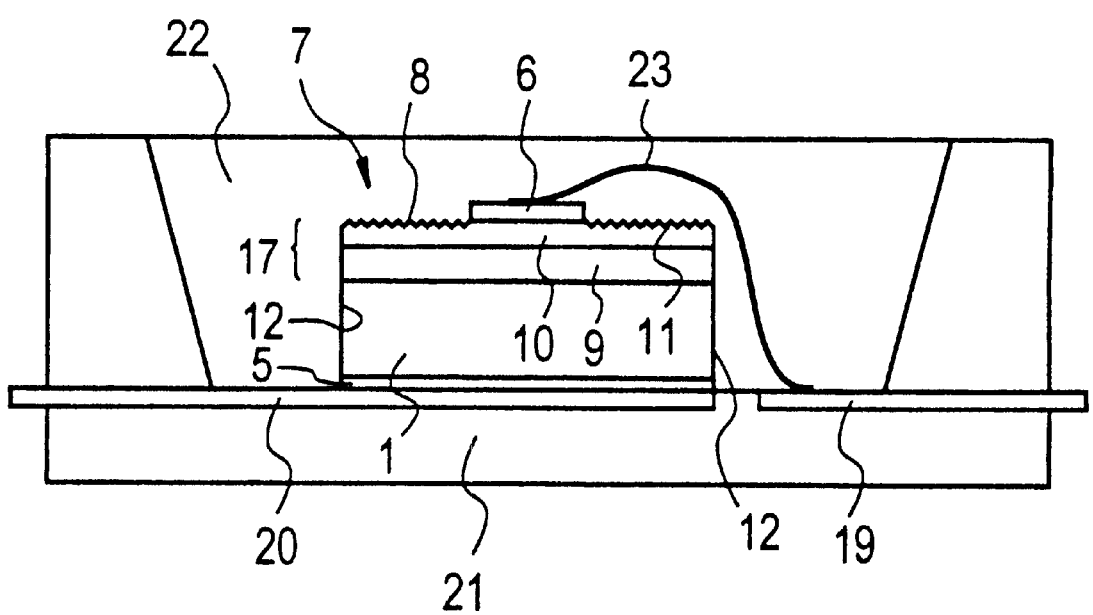
FIG. 2 is a diagrammatic side view of a semiconductor body produced in accordance with a second exemplary embodiment of the process according to the invention.

The semiconductor body illustrated in FIG. 2, which is likewise a light-emitting semiconductor body, once again has a GaP substrate 1. Applied on the GaP substrate is an n-doped, first GaP:N epitaxial layer 9, over which is arranged a p-doped, second GaP:N epitaxial layer 10. The n-doping of GaP results in a reduction of the band gap, the effect of which is that the GaP substrate is again transparent to the light generated in the layer sequence 17 made of first 9 and second 10 GaP:N epitaxial layers.

A further difference from the semiconductor body shown in FIG. 1 is that here only the top side 11 of the semiconductor body is provided with a roughness 8 and the side surfaces 12 are not roughened. The process used to produce the roughness 8 corresponds, for example, to the process explained in connection with FIG. 1.

Furthermore, FIG. 2 shows, by way of example, how the semiconductor body can be incorporated into a conventional LED housing, comprising a first electrical connection 19 and a second electrical connection 20, an opaque base body 21 and a transparent encapsulation 22. The semiconductor body is fastened by its first contact metalization layer 5 on the second electrical connection 20 for example by means of an electrically conductive solder or adhesive. The second contact metalization layer 6 is connected to the first electrical connection 19 by means of a bonding wire 23. The base body 21 partially encloses the electrical connections 19, 20 and has a recess in which the semiconductor body is arranged. The recess is formed for example in such a way that it forms a reflector for the light that is coupled out from the semiconductor body. In addition, the recess is filled with the transparent encapsulation 22, which directly adjoins the free surface 7 of the semiconductor body. The encapsulation 22 is composed of a transparent synthetic resin, for example, and forms, together with the roughness 8 of the semiconductor body, a micro-intermeshing which increases the adhesive strength of the encapsulation 22 on the semiconductor body and thus distinctly reduces the risk of delamination.

It should be understood that, of course, the semiconductor body of FIG. 1 can also be incorporated into a housing of the type shown in FIG. 2. The micro-intermeshing is then naturally formed not only on the top side of the semiconductor body but also on the side areas thereof. Likewise, the housing can also be produced in one piece from a transparent plastic and have any desired form.

As a result of the roughening of the free surface of the semiconductor bodies, a light increase of more than 40% is obtained for example in the case of light-emitting diodes which are provided with the semiconductor bodies described above.

The semiconductor body of FIG. 1 can naturally also be produced in such a way that it has a roughness 8 only on its top side 11. Equally, the semiconductor body of FIG. 2 can be provided with a roughness 8 over its entire free surface 7.

Figure 3A:
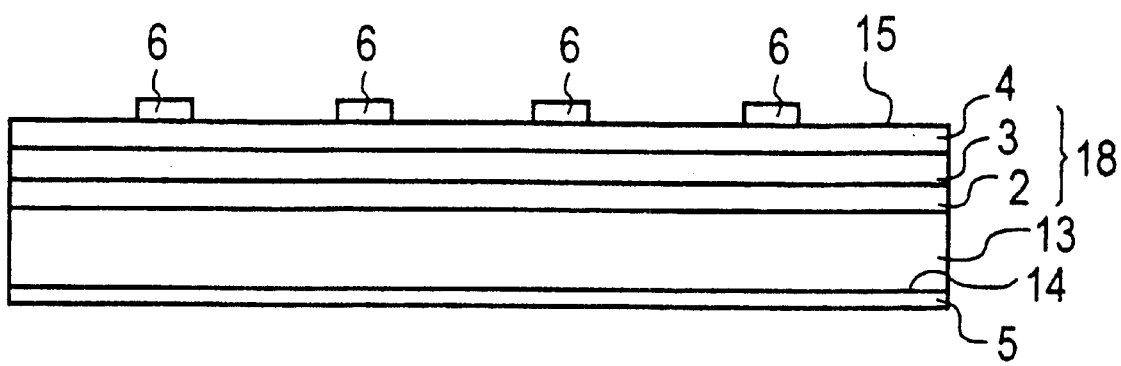
FIGS. 3a, 3b, and 3c are diagrammatic side views illustrating three steps in a process sequence for simultaneously producing a plurality of semiconductor bodies having a roughened surface in accordance with the first exemplary embodiment of the novel process.
Figure 3B:
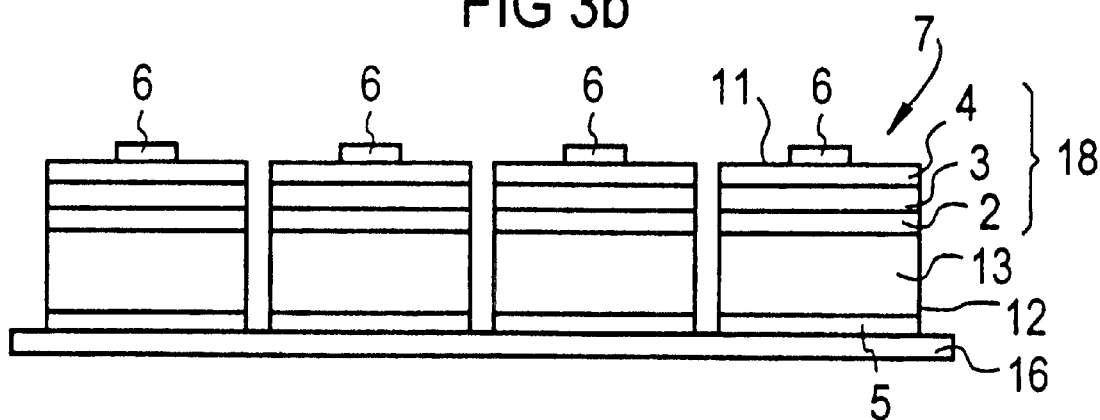
Figure 3C:
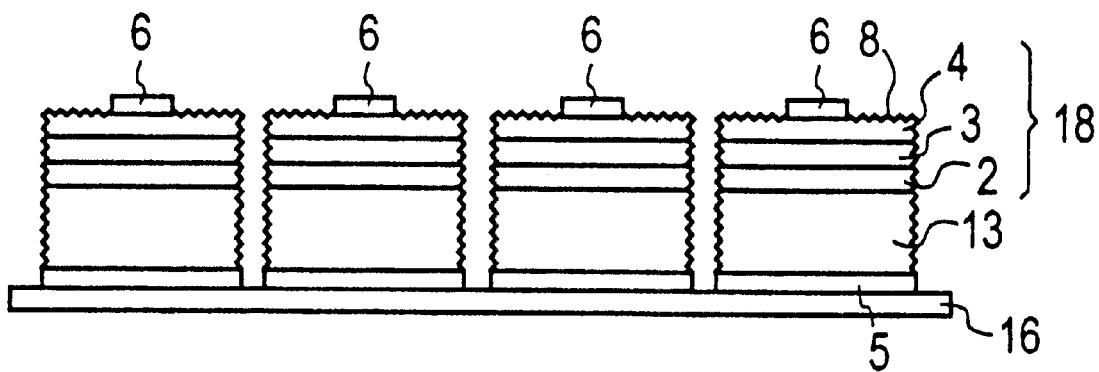

In the case of the process sequence, illustrated diagrammatically in FIGS. 3a to 3c, for simultaneously producing a plurality of semiconductor bodies in accordance with FIG. 1, first of all (FIG. 3a) the first $GaAs_xP_{1-x}$ epitaxial layer 2, the second $GaAs_xP_{1-x}$ epitaxial layer 3 and the third $GaA_xP_{1-x}$ epitaxial layer 4 are applied to a prefabricated GaP substrate wafer 13. The underside 14 of the substrate wafer 13 is provided with the contact metalization layer 5. A plurality of second contact metalization layers 6 are applied to the top side 15 of the third $GaAs_xP_{1-x}$ epitaxial layer 4. The contact metalization layers 5, 6 are produced by means of vapor deposition or sputtering, for example.

With reference to FIG. 3b, the semiconductor wafer—comprising the GaP substrate, the first 2, second 3 and third 4 $GaAs_xP_{1-x}$ epitaxial layers, the first 5 and the second 6 contact metalization layers—is subsequently applied to a holding means 16 or carrier 16, for example an adhesive film, and severed into individual semiconductor bodies. The severing may be effected by sawing, for example.

With reference to FIG. 3c, the free surfaces, that is to say in each case a part of the top side 11 and the side surface 12

(cut sidewalls) of the semiconductor bodies are then roughened, as explained further above, by means of the first and second etching steps. The completed, roughened semiconductor bodies can then be separated from the holding means 16 and processed further to form light-emitting diodes, for example.

Figure 4A:
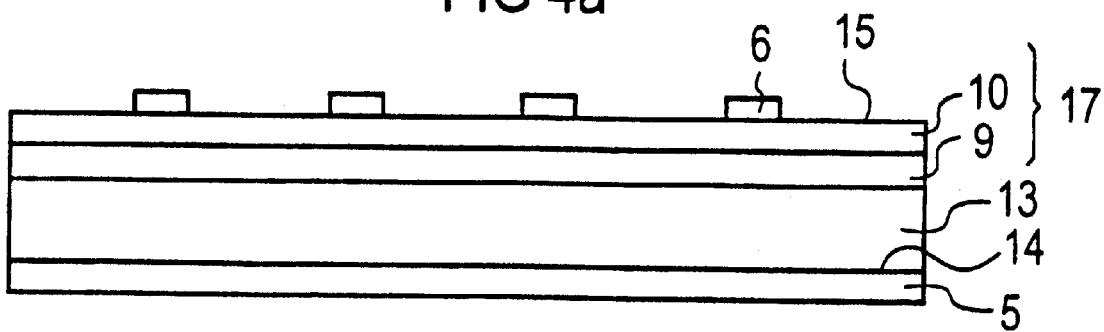
FIGS. 4a, 4b, and 4c are diagrammatic side views illustrating three steps in a process sequence for simultaneously producing a plurality of semiconductor bodies having a roughened surface in accordance with the second exemplary embodiment of the novel process.
Figure 4B:
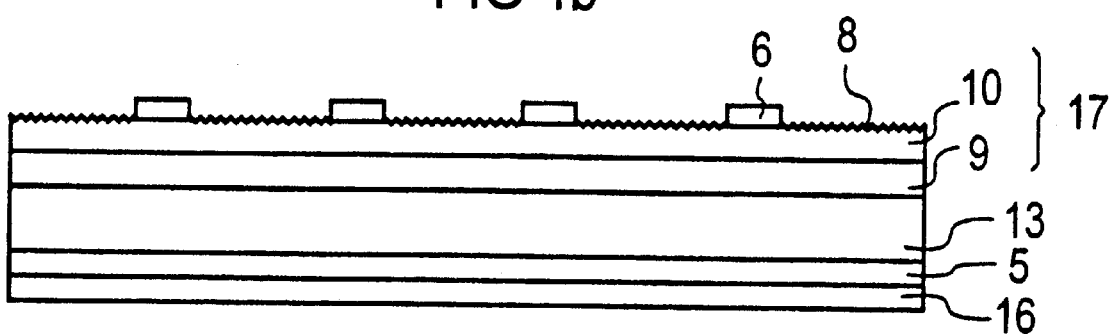
Figure 4C:
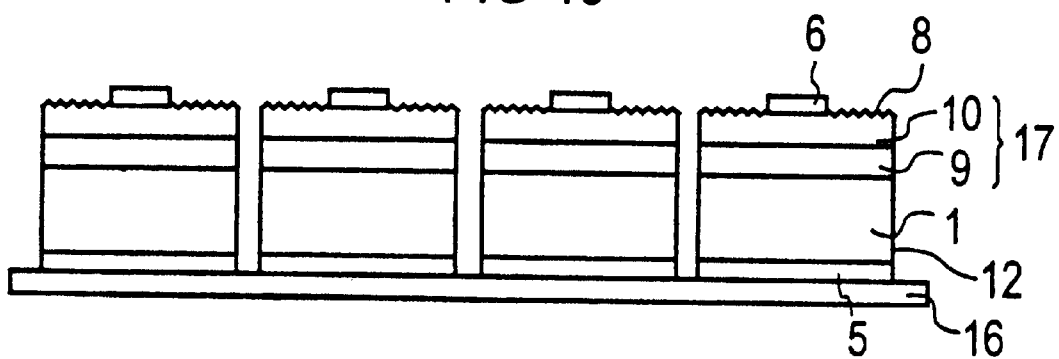

The process sequence, illustrated diagrammatically in FIG. 4, for simultaneously producing a plurality of semiconductor bodies in accordance with FIG. 2 differs from that of FIG. 3 essentially by the fact that the first and second etching steps are carried out prior to the separation of the semiconductor wafer. The effect achieved by this is that only a part, namely that part which is not covered by the contact metalization layers 6, of the top side 11 of the semiconductor wafer is provided with a roughness 8.

Likewise, it may be provided that only the top side 11 and partial regions of the side areas 12 of the semiconductor bodies have a roughness 8. In this case, the semiconductor wafer is not sawn through completely prior to the etching steps but rather is only partly sawn and is separated only after etching.

If a material which would be attacked during one of the two etching steps is used for the second contact metalization layers 6, then these can be covered beforehand with a covering layer which is resistant to the etching solution. The covering layer is then removed after the roughening operation.

We claim:

1. A process for producing a light-emitting and/or light-receiving semiconductor body, which comprises:

providing a semiconductor body with at least one semiconductor layer composed of $GaAs_xP_{1-x}$, where $0 \leq x < 1$, and with a metalization layer partly covering said at least one semiconductor layer;

treating a part of a surface of the semiconductor layer not covered by the metalization layer, in a first etching step with an etching solution having the composition $H_2SO_4:H_2O_2:H_2O$ and in a second etching step with hydrofluoric acid, for producing an even and predictable roughness on the part of the surface of the semiconductor layer.

2. The process according to claim 1, wherein the roughness is a multiplicity of mutually adjacent sawteeth formed in the surface of the semiconductor layer.

3. The process according to claim 1, wherein the providing step comprises providing the semiconductor body with a GaP substrate and applying on the substrate a layer sequence with at least one nitrogen-doped GaP epitaxial layer.

4. The process according to claim 1, wherein the providing step comprises providing the semiconductor body with a GaP substrate and applying on the substrate a layer sequence with at least one $GaAs_xP_{1-x}$ epitaxial layer, where $0 \leq x < 1$.

5. The process according to claim 1, wherein the treating step comprises forming the roughness on an entire free surface of the semiconductor body.

6. The process according to claim 1, wherein the first etching step comprises selecting a ratio of 3:1:1 for the etching solution $H_2SO_4:H_2O_2:H_2O$, choosing a temperature of between 15 and 80° C. and an etching duration of between 30 seconds and 10 minutes.

7. The process according to claim 1, wherein the second etching step comprises etching with 40–50% hydrofluoric acid by weight, at a temperature of between 15 and 30° C., and for an etching duration of between 30 minutes and 120 minutes.

8. A process for simultaneously producing a plurality of light-emitting and/or light-receiving semiconductor bodies having at least one semiconductor layer composed of a semiconductor material selected from the group consisting of $GaAs_xP_{1-x}$, where $0 \leq x < 1$, and GaP:N, the method which comprises:

forming a layer sequence of $GaAs_xP_{1-x}$, where $0 \leq x < 1$, on a GaP substrate wafer;

applying a first contact metalization to an underside of the substrate wafer and applying at least one second contact metalization to a top side of the layer sequence;

treating a free surface of the layer sequence with an etching solution having the composition $H_2SO_4:H_2O_2:H_2O$ in a first etching step and with hydrofluoric acid in a second etching step, for producing a roughness in the free surface; and severing a semiconductor wafer comprising the substrate wafer, the layer sequence, the first contact metalization and the second contact metalization into individual semiconductor bodies.

9. The process according to claim 8, wherein the first etching step comprises selecting a ratio of 3:1:1 for the etching solution $H_2SO_4:H_2O_2:H_2O$, choosing a temperature of between 15 and 80° C. and an etching duration of between 30 seconds and 10 minutes.

10. The process according to claim 8, wherein the second etching step comprises etching with 40–50% hydrofluoric acid by weight, at a temperature of between 15 and 30° C., and for an etching duration of between 30 minutes and 120 minutes.

11. A process for simultaneously producing a plurality of light-emitting and/or light-receiving semiconductor bodies having at least one semiconductor layer composed of a semiconductor material selected from the group consisting of $GaAs_xP_{1-x}$, where $0 \leq x < 1$, and GaP:N, the method which comprises:

forming a layer sequence of $GaAs_xP_{1-x}$, where $0 \leq x < 1$, on a GaP substrate wafer;

applying a first contact metalization to an underside of the substrate wafer and applying a plurality of second contact metalizations to a top side of the layer sequence;

placing a semiconductor wafer comprising the substrate wafer, the layer sequence, the first contact metalization, and the second contact metalization on a carrier;

severing the semiconductor wafer into individual semiconductor bodies with free surfaces; and treating the free surfaces of the semiconductor bodies with an etching solution having the composition $H_2SO_4:H_2O_2:H_2O$ in a first etching step and with hydrofluoric acid in a second etching step, for producing a roughness in the free surfaces.

12. The process according to claim 11, wherein the first etching step comprises selecting a ratio of 3:1:1 for the etching solution $H_2SO_4:H_2O_2:H_2O$, choosing a temperature of between 15 and 80° C. and an etching duration of between 30 seconds and 10 minutes.

13. The process according to claim 11, wherein the second etching step comprises etching with 40–50% hydrofluoric acid by weight, at a temperature of between 15 and 30° C., and for an etching duration of between 30 minutes and 120 minutes.

* * * * *